United States Patent [19]
Snodgrass et al.

[11] Patent Number: 6,005,373
[45] Date of Patent: Dec. 21, 1999

[54] SYSTEM WITH ANTICIPATORY POWER SUPPLY LOAD SIGNAL

[75] Inventors: Charles K. Snodgrass; Robert L. Totorica, both of Boise, Id.

[73] Assignee: Micron Technology, Inc., Boise, Id.

[21] Appl. No.: 09/179,563

[22] Filed: Oct. 27, 1998

[51] Int. Cl.⁶ .................................................. G05F 1/44
[52] U.S. Cl. ............................................................ 323/266
[58] Field of Search ................................. 323/266, 270, 323/271, 273, 275

[56] References Cited

U.S. PATENT DOCUMENTS

| | | | |
|---|---|---|---|
| 4,183,082 | 1/1980 | Ishii | 363/89 |
| 4,587,604 | 5/1986 | Nerone | 363/17 |
| 5,105,182 | 4/1992 | Shindo | 340/663 |
| 5,705,920 | 1/1998 | Watanabe et al. | 323/285 |
| 5,804,950 | 9/1998 | Hwang | 323/222 |
| 5,838,148 | 11/1998 | Kurokami et al. | 323/299 |

*Primary Examiner*—Matthew Nguyen
*Attorney, Agent, or Firm*—Dickerstein Sharpiro Morin & Oshinsky LLP

[57] ABSTRACT

A method and system that uses an anticipatory signal to pre-adjust the output of the power supply to compensate for an upcoming load change, thereby minimizing the voltage deviation at the load. A control circuit, such as a processor, controlling the system generates an anticipatory signal indicating an upcoming change in the load that is input to the power supply. The power supply, in response to the signal from the processor, adjusts the output of the power supply accordingly to compensate for the upcoming load change. When the system performs the operation that results in the load change, the power supply output has already been adjusted accordingly and the deviation of the load voltage caused by the change in the load is minimized.

51 Claims, 5 Drawing Sheets

SYSTEM WITH ANTICIPATORY POWER SUPPLY LOAD SIGNAL

BACKGROUND OF THE INVENTION

1. Field of the Invention

The present invention relates generally to a system that uses an anticipatory signal to regulate the output of a power supply in the system, and more particularly to a memory test system that utilizes a signal which anticipates a load change to regulate the power supply output to compensate for the load changes before they occur, thereby minimizing voltage deviation at the load.

2. Description of the Related Art

Memory tests on random access memory (RAM) integrated circuits, such as DRAMs and RAMs and the like are typically performed by the manufacturer during production and fabrication and also by a downstream manufacturer of a computer or processor controlled system at the fabrication manufacturer level to determine if the circuits are operating as intended. The testing is typically performed by a memory controller or processor (or a designated processor in a multi processor machine) which runs a testing program.

Random access memories include an array of memory cells arranged in rows and columns. After packaging, a plurality of tests are typically performed on the device in order to determine whether there is an actual or latent defect in one or more of the memory cells which would render a memory unreliable. For example, to determine if a hidden defect exists, random access memories are typically subjected to data retention tests and/or data march tests. In data retention tests, every cell of the memory is written and checked after a pre-specified interval to determine if leakage current has occurred that has affected the stored logic state. In a march test, a sequence of read and/or write operations is applied to each cell, either in increasing or decreasing address order. To determine if there is a defect in the array of bits that may fail over time, burn-in testing is typically performed to accelerate failure using voltage and temperature stress. When a failed memory cell is detected through testing, the column or row in which the failed memory cell is located is typically substituted by a redundant column or row of memory cells.

In order to reduce the time required to perform the testing of memory chips, the testing process is performed on a plurality of memory devices simultaneously. In addition, automated testing systems have been developed to further reduce the time required and simplify the testing process of memory devices.

FIG. 1 illustrates in block diagram form a conventional testing system used to perform tests on integrated circuits such as memory devices. Test system 20 generally comprises a processor 22, which controls a test device 24. Test device 24 is connected to a device under test (DUT) 26. DUT 26 contains the memory devices being tested. DUT 26 is connected to test device 24 by a communication path 28, and can be placed separate from test device 24 in order to perform environmental testing. For example, burn-in testing is typically performed at an elevated ambient temperature in a thermal chamber. Power supply 28 supplies power (Vload) to DUT 26 for operation via conductor 30.

The typical operation of test system 20 is as follows. The memory devices desired to be tested are placed onto DUT 26. Typically, a plurality of memory devices, such as for example, a group of 256 memory devices, will be tested together at the same time. Processor 22 executes a program to control test device 24 to run through a test sequence. Test device 24, in response to the signals from processor 22, performs various tests on each memory device on DUT 26, such as data retention, data march, and burn-in tests previously discussed. Typically, each test is performed on every memory device on DUT 26 simultaneously. Based on the results of the tests performed, test device 24 determines if a memory device on DUT 26 is faulty. Power is supplied to DUT 26 by power supply 28, since it is necessary to have the memory devices powered in order to properly test them.

There are some problems, however, with the conventional test system 20 as illustrated in FIG. 1. Each memory device on DUT 20 has a required power supply rating, i.e. operating voltage, with a certain tolerance. To prevent malfunctioning of the memory device, or in some cases even damage to the memory device, it is important to maintain the supply voltage within the tolerance of the rated supply voltage. Power supply 28 is typically designed to provide the proper voltage to the memory devices on DUT 26. Additionally, power supply 28 typically includes some type of feedback circuit or circuits, as are known in the art, to compensate for changes in the load current which may cause deviations in the supply voltage. There are several dynamic variables that may influence the load current required by DUT 26 during a test sequence, such as the number of devices under test and the specific test being performed. In addition, static variables such as the impedance of the conductor 30 between power supply 28 and DUT 26 can also contribute to a deviation, such as a voltage drop, in the supply voltage. Although the impedance of conductor 30 is typically very small, for example less than 0.01 ohms, when large currents are passed through conductor 30, there will be an associated voltage drop across conductor 30. While the voltage drop across conductor 30 may only be in the range of tenths or hundredths of a volt, this may be significant enough to adversely impact upon the supplied operating voltage to the memory devices.

Sudden changes in the load current cause the output voltage of power supply 28 to deviate for a short period of time until a negative feedback circuit of power supply 28 can adjust the output voltage. The greater the increase or decrease in the load current, the greater the deviation in the output voltage of power supply 28. Thus, the feed back circuit provided in power supply 28 monitors the output voltage and adjusts it accordingly should an increase or decrease in the output voltage, caused by a change in the load current, be detected. Such a feedback system, however, may not be suitable to adequately adjust the output voltage when a relatively large change in the load current is experienced over a short period of time. In test system 20, up to several hundred memory devices may be under test simultaneously. During the performance of the tests, since each memory device performs the same test operation simultaneously and each memory device requires power to operate, the load current required by DUT 26 can increase from 0 to 20 Amperes in as little as 100 $\mu s$.

FIG. 2 illustrates a waveform for the output voltage Vload of power supply 28 that is applied to DUT 26. Vload represents the operating voltage rating of each memory device on DUT 26, and may be for example 3 V ±0.2 V. Thus, the minimum input voltage, represented by Vmin, would be 2.8 V in this example and the maximum input voltage, represented by Vmax, would be 3.2 V in this example. At time $t_1$, a test is initiated by test device 24 that requires each memory device on DUT 26 to perform some operation that requires an increase in its drawn current. While the increase in drawn current by each memory device"

on DUT 26 is relatively small, the increase in the current drawn by DUT 26 is the sum of drawn currents for every memory device on DUT 26 and can be significant, such as the 20 A noted above. As the load increases, the output voltage Vload of power supply 28 will decrease. The feedback circuit of power supply 28 will sense the decrease in Vload, and at some time $t_2$ will operate to adjust Vload in response. However, if there is a significant load change in a short period of time, the feedback system may be unable to adjust in time to prevent output voltage Vload from falling below Vmin, as illustrated. Additionally, the feedback circuit of power supply 28 may overcompensate for the load change, and at some time $t_3$ the output voltage Vload may increase above Vmax. At time $t_4$, the output voltage Vload levels off to the proper level.

Thus, there exists a need for a test system and power supply that are capable of compensating for large changes in the load in a short time period while maintaining the supply voltage within acceptable tolerance levels.

SUMMARY OF THE INVENTION

The present invention overcomes the problems associated with the prior art and provides a unique method and apparatus for providing an anticipatory signal to a power supply to indicate a forthcoming change in the load. The anticipatory signal is used by the power supply to pre-adjust the output voltage to compensate for the anticipated load changes, thereby decreasing the response time for feedback adjustment and minimizing the deviation of the supply voltage from the power supply to the load.

In accordance with one specific application of the present invention, a control signal is generated by a processor directing the start of a device test sequence that will, as conducted, increase the load on the power supply. A corresponding anticipatory signal is input directly to the power supply, which in response to the anticipatory signal adjusts the output voltage being supplied to the device under test to compensate for the upcoming change in the load. The control signal is input to the test device through a delay, so when the test device receives the control signal and performs the test sequence on the device under test, the supply voltage to the device under test has already been adjusted accordingly. In this manner, the deviation of the load voltage can be minimized.

In accordance with a second application of the present invention, a monitor is used to monitor the output voltage of the power supply during pre-adjustment and to provide additional information to the processor to provide further preliminary adjustments to the power supply. The additional control of the pre-adjustment of the output voltage will further reduce any variations in the output voltage of the power supply input to the device under test.

These and other advantages and features of the invention will become apparent from the following detailed description of the invention which is provided in connection with the accompanying drawings.

DETAILED DESCRIPTION OF THE PREFERRED EMBODIMENTS

The present invention will be described as set forth in the preferred embodiment illustrated in FIGS. 3–6. Other embodiments may be utilized and structural, logical or programming changes may be made without departing from the spirit or scope of the present invention.

Figures 1, 2:
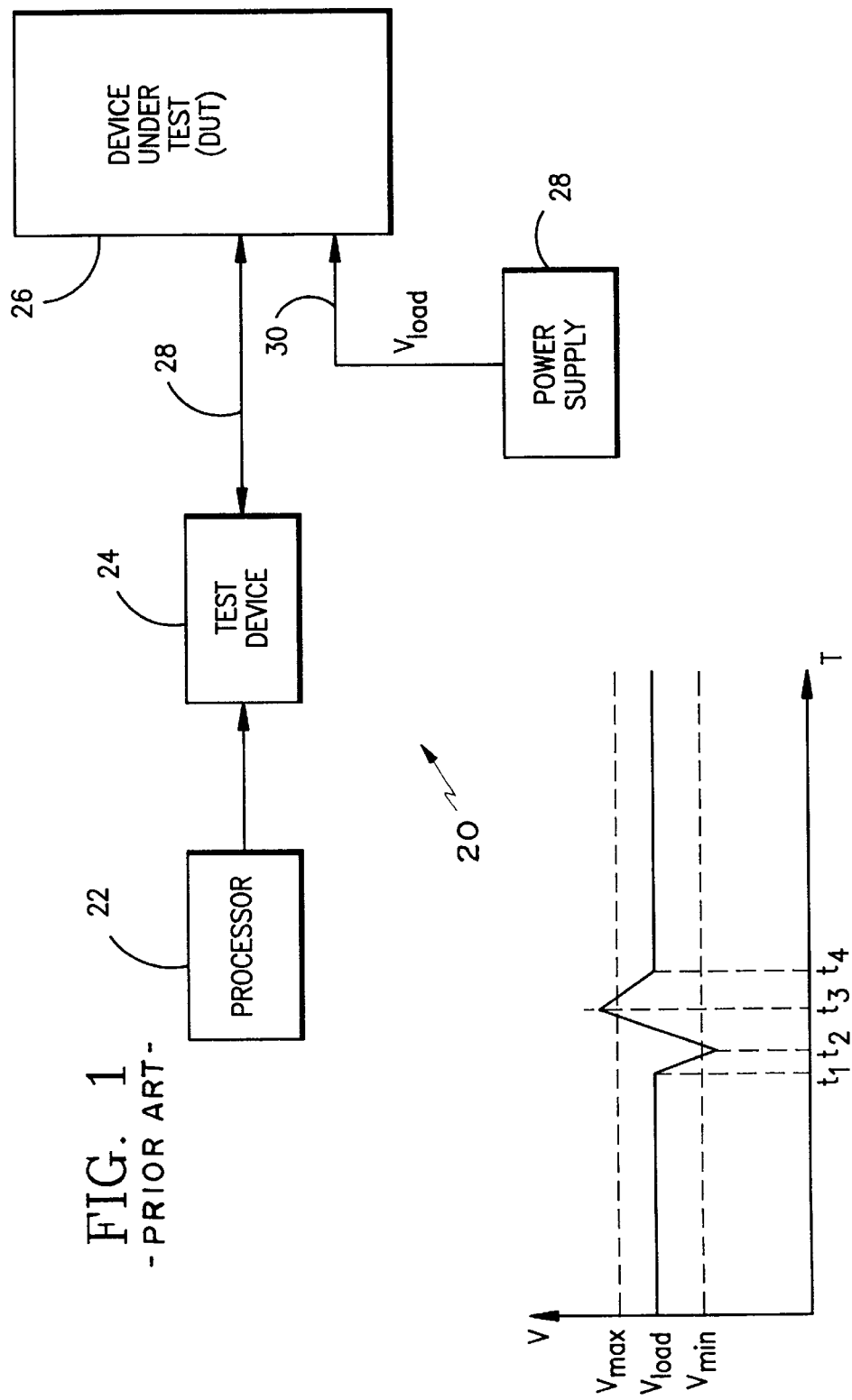
FIG. 1 illustrates in block diagram form a conventional testing system used to perform tests on integrated circuits such as memory devices.
FIG. 2 illustrates an output voltage waveform of a power supply during operation of a test in the conventional test system.
Figure 3:
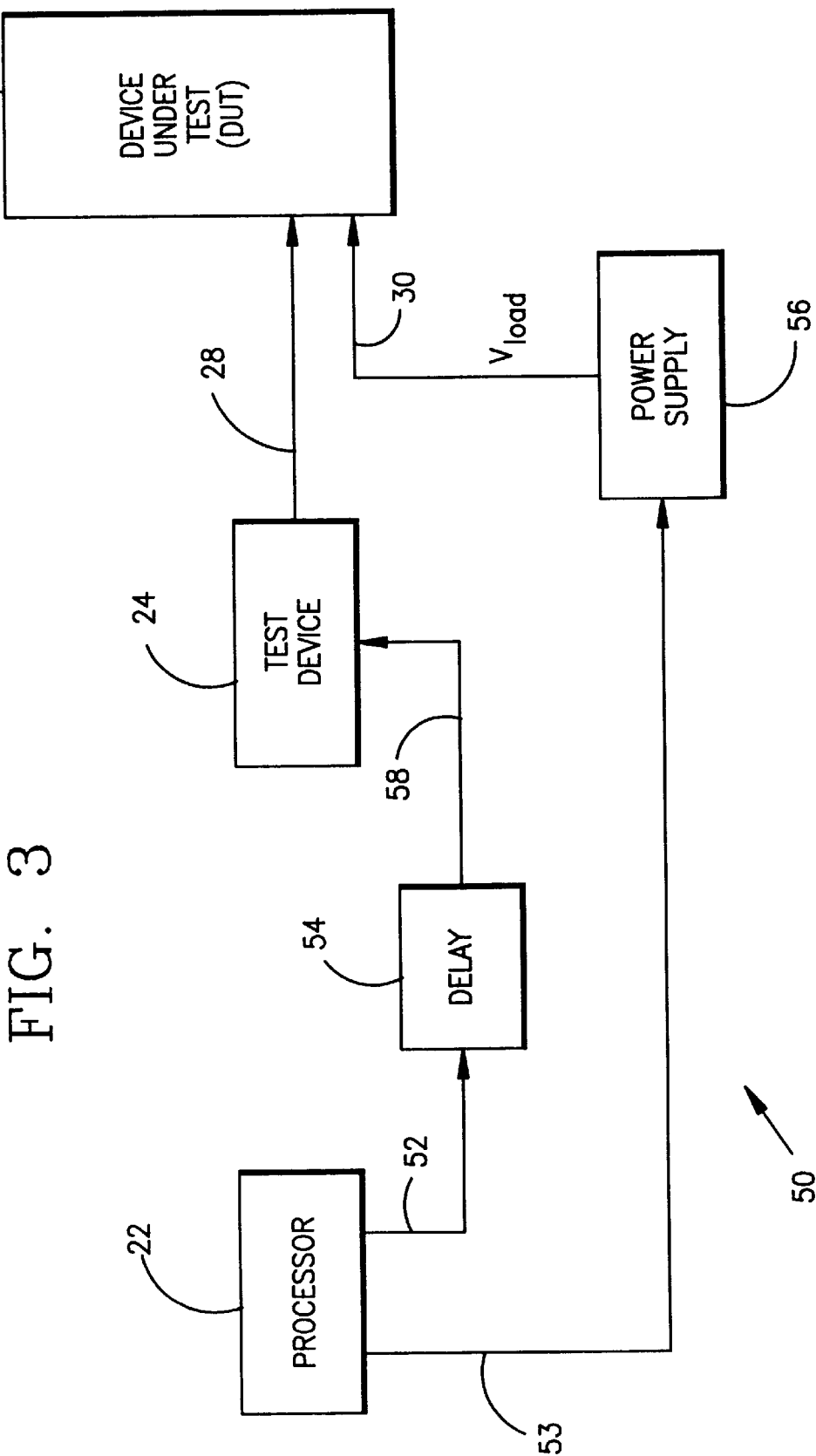
FIG. 3 illustrates in block diagram form a test system in accordance with the present invention.

A test system in accordance with the present invention is illustrated generally at 50 in FIG. 3. Like items from the test system 20 of FIG. 1 are referred to by like numerals. Test system 50 includes a of processor 22 having output lines 52, 53 connected to delay 54 and to power supply 56, respectively. Processor 22 is part of the control circuit used to generate a control signal and a corresponding anticipatory signal, as described below, in accordance with the present invention. Delay 54 is connected to test device 24 by communication path 58. Test device 24 is connected to a device under test (DUT) 26. DUT 26 contains the memory devices being tested. DUT 26 is connected to test device 24 by a communication path 28, and can be placed separate from test device 24 in order to perform environmental testing. For example, burn-in testing is typically performed at an elevated ambient temperature in a thermal chamber. Power supply 56 supplies power (Vload) to DUT 26 for operation via conductor 30.

The operation of test system 50 is as follows. The memory devices desired to be tested are placed onto DUT 26. Typically, a plurality of memory devices will be tested together at the same time. For example, in order to maintain timing and throughput, typically 256 memory devices would be tested simultaneously. Processor 22 executes a program to control test device 24 through delay 54 to run through a test sequence. Test device 24, in response to the control signals from processor 22 through delay 54, performs various tests on each memory device on DUT 26, such as data retention, data march, and burn-in tests previously discussed. Alternatively, delay 54 may not be provided and processor 22 connected directly to test device 24.

In accordance with the present invention, an anticipatory signal corresponding to the control signal sent from processor 22 to delay 54 is generated and input to power supply 56 on conductor 53 in order to pre-adjust the output of power supply 56 for upcoming load changes in DUT 26. The generated anticipatory signal will provide power supply 56 with information relating to the pre-adjustment of the output voltage Vload, such as the desired increase in magnitude of output voltage Vload, the time and duration of the increase and so forth, based on the known variables of the test sequence. For example, dynamic variables such as the number of memory devices being tested on DUT 26 and the test sequence about to be performed are known by processor 22. Static variables such as the impedance of conductor 30 are also known. Utilizing these variables, a control circuit, i.e., processor 22, can calculate the change in input current DUT 26 will require in order to perform the test sequence, and determine the amount of compensation required by power supply 56 to accommodate the change in load current.

When processor 22 outputs a control signal on line 52 indicating a specific test to be performed, a corresponding anticipatory signal is output on line 53 and input to power supply 56 to signal the forthcoming load change in DUT 26. Power supply 56, in response to the anticipatory signal from processor 22, adjusts its output voltage Vload in order to compensate for the upcoming load change by DUT 26. The control signal from processor 22 is input to test device 24 through delay 54. Thus, when test device 24 receives the control signal indicating a specific test to be performed, power supply 56, in response to the anticipatory signal from processor 22, has already adjusted its output Vload to compensate for the test to be performed as controlled by test device 24. Alternatively, if delay 54 is not provided, processor 22 could delay the sending of control signal on line 52 or a delay could be built into processor 22 so that when the control signal is received by test device 24, power supply 56 has already adjusted its output Vload to compensate for the test to be performed as controlled by test device 24. The pre-adjustment of the output Vload of power supply 56 minimizes the deviation in the voltage Vload due to the load change when a test sequence is performed on DUT 26.

Figure 4:
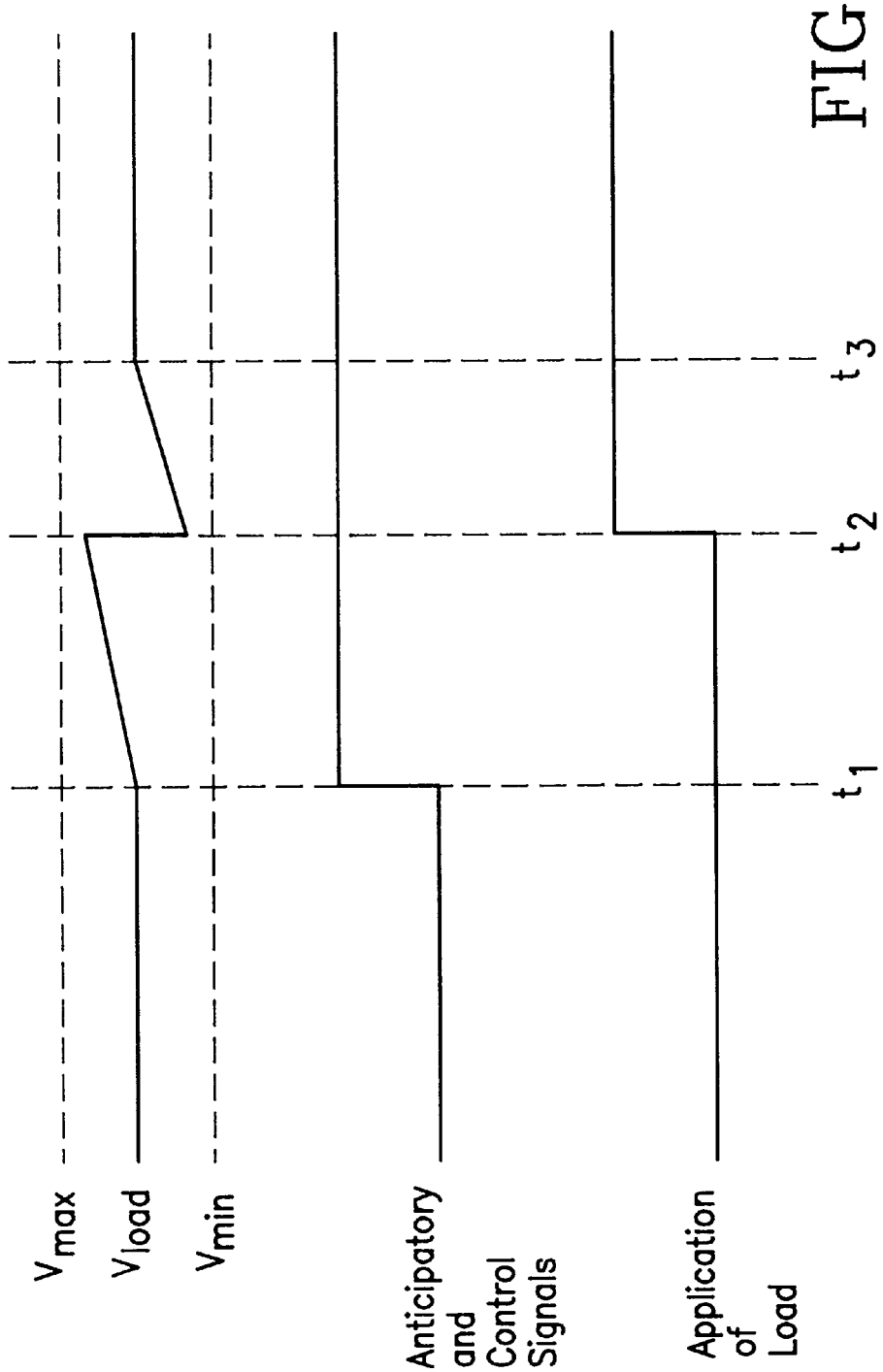
FIG. 4 illustrates a timing diagram of signals in the system illustrated in FIG. 3.

A timing diagram showing waveforms for Vload, the control signal and corresponding anticipatory signal and application of the load according to the present invention is illustrated in FIG. 4. At time $t_1$, processor 22 outputs a control signal on line 52 and a corresponding anticipatory signal on line 53 indicating a specific test sequence is to be performed. The anticipatory signal is input directly to power supply 56, while the control signal is input to delay 54. Power supply 56, upon receipt of the anticipatory signal from processor 22, pre-adjusts its output voltage Vload by ramping it up to a value higher than Vload but still within the maximum tolerance level Vmax. At time $t_2$, test device 24 receives the control signal from delay 54 on line 58. In response to receipt of the control signal from delay 54, test device 24 starts the test sequence, thereby causing DUT 26 to increase the load on power supply 56. The application of the increased load by DUT 26 causes the output voltage Vload of power supply 56 to decrease, however, because of the pre-adjustment of Vload, the decrease will not fall below the minimum tolerance Vmin. The feedback circuit of power supply 56 will respond to the decrease in the output voltage Vload and adjust the output voltage Vload to return to its proper level Vload. At time $t_3$, the output voltage Vload levels off to its original value.

As previously noted, the generated anticipatory signal will provide power supply 56 with information relating to the pre-adjustment of the output voltage Vload, such as the desired increase in magnitude of output voltage Vload, the time and duration of the increase and so forth, based on the known variables of the test sequence. While the change in output voltage Vload is illustrated in FIG. 4 as a ramped signal, the response of Vload to the anticipatory signal according to the present invention is not so limited. Typically, the waveform shape of Vload is determined by the response characteristics of power supply 56, and may be a square wave, a ramp, etc.

Utilizing the anticipatory signal of the present invention, the deviation of the output Vload of power supply 56 is minimized such that the voltage Vload will remain within the minimum tolerance required by the memory devices being tested on DUT 26. Furthermore, the reduction in the amount of deviation of the supply voltage below Vload will enable the feedback circuitry of the power supply to adjust the output voltage Vload without overcompensating and increasing the output voltage Vload above Vmax. In addition, the time required for the voltage Vload to return to its rated level will be quicker than in the conventional test system as illustrated in FIG. 1 due to the smaller deviation in the output voltage.

Figure 5:
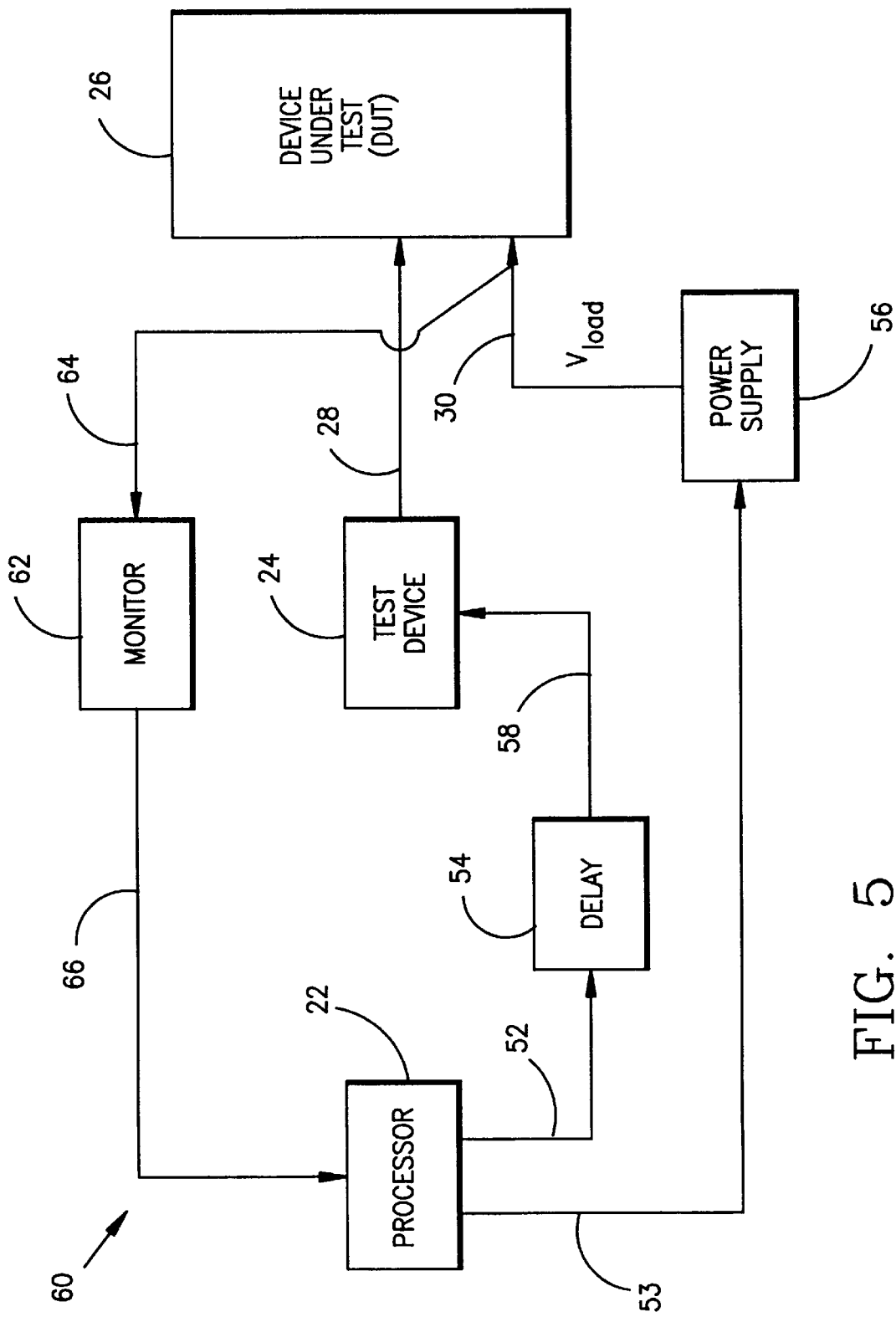
FIG. 5 illustrates in block diagram form a test system in accordance with a second embodiment of the present invention.

A test system 60 in accordance with a second application of the present invention is illustrated generally in block diagram form in FIG. 5. Like items from the test system 50 of FIG. 3 are referred to by like numerals. Test system 60 includes a processor 22 having output lines 52, 53 connected to delay 54 and to power supply 56, respectively. Delay 54 is connected to test device 24 by communication path 58. Test device 24 is connected to a device under test (DUT) 26. DUT 26 contains the memory devices being tested. DUT 26 is connected to test device 24 by a communication path 28, and can be placed separate from test device 24 in order to perform environmental testing. For example, burn-in testing is typically performed at an elevated ambient temperature in a thermal chamber. Power supply 56 supplies power (Vload) to DUT 26 for operation via conductor 30. Monitor 62 is connected to the output voltage Vload of power supply 56 and to processor 22.

The operation of test system 60 is similar to that as described with respect to test system 50 except with the following differences. Monitor 62 is used to measure and monitor the output voltage Vload of power supply 56 via conductor 64 during the performance of specified tests. Based on the level of the measured output voltage during the specified tests, a signal will be sent from monitor 62 to processor 22 via conductor 66. The signal sent from monitor 62 is received by processor 22 and used to provide further adjustments to the output of power supply 56 for future tests. For example, if monitor 62 measures an output voltage Vload that is higher than required for a specified test, a signal will be sent by monitor 62 to processor 22 indicating the output voltage Vload can be decreased the next time that test is performed. Conversely, if the output voltage Vload as measured by monitor 62 during a specific test is not high enough for that test, monitor 62 will send a signal to processor 22 indicating the output voltage Vload must be increased the next time that a test is performed. Alternatively, monitor 62 can measure the output voltage Vload during a specified test and input the measured output voltage to processor 22. Processor 22 can use the measured output voltage to determine whether or not the output voltage was properly pre-adjusted for a specific test. In this manner, the pre-adjustment of the output voltage Vload can be calibrated to further reduce any variations in the output voltage Vload of power supply 56.

Figure 6:
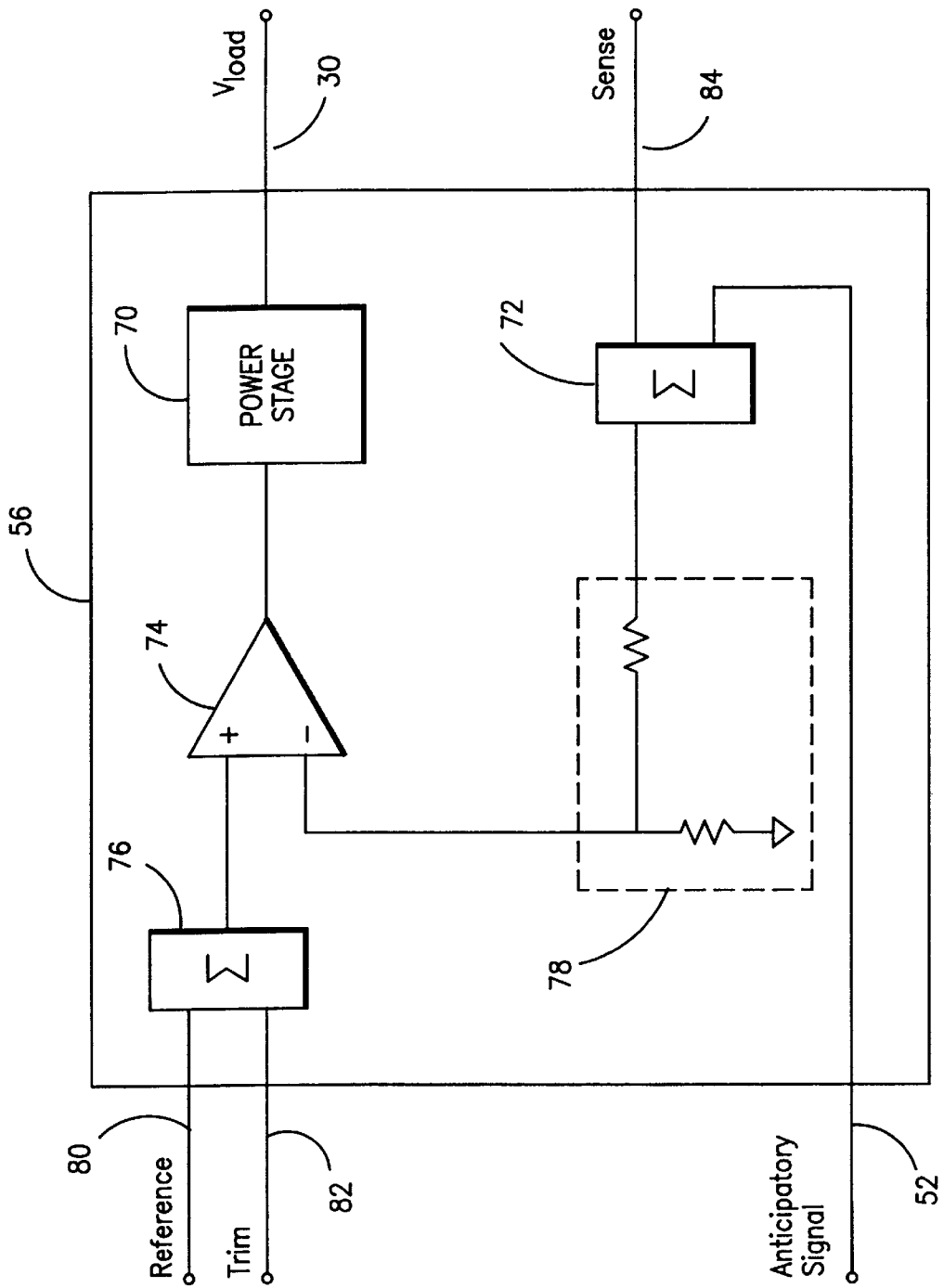
FIG. 6 illustrates in block diagram form a power supply in accordance with the present invention.

A portion of power supply 56 is illustrated generally in block diagram form in FIG. 6. Specifically, a portion of the feedback circuitry and anticipatory load signal circuitry in accordance with the present invention are shown.

Power supply 56 generally consists of power stage 70, comparator 74, summation circuits 72, 76, and regulating circuitry 78, such as a voltage divider. The anticipatory load signal from processor 22 is input to summation circuitry 72 via conductor 53. A Reference signal and Trim signal are input to summation circuitry 76 via conductors 80 and 82, respectively. The output of summation circuitry 76 is input to comparator 74 to set the nominal output voltage of power stage 70. The output of regulating circuitry 78 is input to the other input of comparator 74. The output of comparator 74 is input to power stage 70. The output of power stage 70 is output from the power supply as the output voltage Vload on conductor 30. The output Vload is also input back in to summation circuit 72. The output of summation circuit 72 is input to regulating circuitry 78.

The operation of power supply 56 is as follows. Power supply 56 is designed to output a predetermined specified voltage output Vload from power stage 70. A signal representing the level of the predetermined desired output voltage Vload is input to summation circuit 76 as a Reference signal on conductor 80. Trim signal on conductor 82 is also input to summation circuit 76 and allows further minor adjustments of the output voltage level Vload. The Trim signal may either be automatically controlled or manually controlled. A signal representing the measured output voltage Vload applied to a load is input into summation circuit 72 via conductor 84 as a Sense signal. The output from summation circuit 72 is input to regulating circuitry 78, and then into comparator 74. Comparator 74 is used to compare the output signal from regulating circuitry 78 with the output signal from summation circuit 76. If the value of the output voltage Vload falls below the desired level for Vload, comparator 74 will output a signal to power stage 70 to increase the value of the output voltage Vload. Conversely, if the value of the output voltage rises above the desired level for Vload, comparator 74 will output a signal to power stage 70 to decrease the value of the output voltage Vload. Such types of feedback regulation for power supplies are well known in the art.

In accordance with the present invention, an anticipatory signal is input from a control circuit, such as processor 22, to power supply 56 on conductor 53. While the anticipatory signal from processor 22 is typically a digital signal, requiring conversion from a digital to analog format by a Digital to Analog (D/A) converter, as is known in the art, should an analog circuit such as illustrated in FIG. 6 be used, the invention is not so limited and any combination of digital/analog signals may be used. The anticipatory signal is input into summation circuit 72 along with the sense signal on conductor 84. When the anticipatory signal is input to summation circuit 72, the output of regulating circuit 78 input to comparator 74 will cause comparator 74 to input a signal to power stage 70 to increase the level of the output voltage Vload. In this manner, the level of output voltage Vload can be increased prior to a change in the load that would cause a corresponding decrease in the level of the output voltage Vload. Since the anticipatory signal is input to summation circuit 72 along with the Sense signal, the operation of the conventional feedback circuitry as previously described is not affected.

It is important to note that the anticipatory signal and associated processing may be done in either a digital format or an analog format, depending upon the required application and corresponding environment. In addition, the present invention may be implemented in a hardware format, a software format, or a combination of the two and are considered equivalent.

Furthermore, while the present invention has been described with respect to a testing system for memory devices, the present invention need not be so limited. The present invention may be used in a test system for testing any type of electronic device. Additionally, the present invention may be used in any type of power supply system that may experience changes in the load which would cause an associated drop in the output voltage of the power supply in the system. As long as dynamic variables such as the amount of change in the load and the time of the change in the load are known, an anticipatory signal can be used to pre-adjust the output of the power supply to compensate for the upcoming load change.

Reference has been made to preferred embodiments in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. A power supply system comprising:
   a power supply providing an output voltage to supply a load; and
   a control circuit connected to said power supply to control said power supply system,
      whereby when said control circuit determines an upcoming change in said load, an anticipatory signal is sent by said control circuit to said power supply and said power supply in response to said anticipatory signal adjusts a level of said output voltage before said upcoming change in said load, thereby minimizing a deviation in said output voltage supplied to said load when said load change occurs.

2. The power supply system according to claim 1, further comprising:
   a test device connected between said control circuit and said load; and
   a control signal associated with said anticipatory signal, said control signal being output from said control circuit to said test device,
      wherein said test device controls said change in said load in response to said control signal from said control circuit.

3. The power supply system according to claim 2, further comprising:
   a delay connected between said control circuit and said test device,
      wherein said control signal from said control circuit is received by said test device after said anticipatory signal has been received by said power supply and said power supply has adjusted said level of said output voltage to compensate for said change in said load.

4. The power supply system according to claim 3, wherein said control circuit comprises a processor.

5. The power supply system according to claim 3, wherein said load is a plurality of memory devices which are simultaneously subjected to at least one test.

6. The power supply system according to claim 5, wherein said test device operates to control said at least one test in response to said control signal from said control circuit.

7. The power supply system according to claim 6, further comprising:
   a monitor connected between said output of said power supply and said control circuit,
      wherein said monitor measures said output voltage being supplied from said power supply to said load during a specified test and supplies a monitor signal to said control circuit representing said measured output voltage.

8. The power supply system according to claim 7, wherein said monitor further provides an adjustment signal to said control circuit, said adjustment signal changing said anticipatory signal to provide further adjustments to said output voltage during a subsequent performance of a test.

9. The power supply system according to claim 7, wherein said control circuit uses said monitor signal to adjust said anticipatory signal to provide further adjustments to said output voltage during a subsequent performance of a test.

10. The power supply system according to claim 2, wherein said power supply comprises:

a power stage to provide said output voltage to an output of said power supply; and an input to receive said anticipatory signal, said anticipatory signal preceding a change in said load, wherein said power stage adjusts said output voltage based on said anticipatory signal before said change in said load.

11. The power supply system according to claim 10, wherein said power supply further comprises:

a first summation circuit having a first input connected to said output of said power supply, a second input connected to said anticipatory signal, and an output.

12. The power supply system according to claim 11, wherein said power supply further comprises:

a reference signal input, said reference signal input representing a level of said output voltage; and a comparator having a first input connected to said reference input signal, a second input connected to said output of said first summation circuit, and an output connected to said power stage, wherein said power stage adjusts said output voltage based on a result of a comparison of said reference signal level and a signal level on said output of said first summation circuit.

13. The power supply system according to claim 12, wherein said power supply further comprises:

a second summation circuit having a first input connected to said reference signal input, a second input connected to a trim signal input, and an output connected to said first input of said comparator, whereby said trim signal input is used to provide further adjustments to said output voltage of said power supply.

14. The power supply system according to claim 13, wherein said trim signal can be manually adjusted.

15. The power supply system according to claim 13, wherein said power supply further comprises:

regulating circuitry connected between said output of said first summation circuit and said second input of said comparator, said regulating circuitry controlling a level of a signal input to said second input of said comparator from said first summation circuit.

16. The power supply system according to claim 15, wherein said regulating circuitry is a voltage divider.

17. A test system for testing at least one electronic device, said test system comprising:

a power supply providing an output voltage to said at least one electronic device, said at least one electronic device providing a load on said power supply; and a control circuit connected to said power supply to control said test system, whereby when said control circuit determines an upcoming change in said load, an anticipatory signal is sent by said control circuit to said power supply and said power supply in response to said anticipatory signal adjusts a level of said output voltage to compensate for said upcoming change in said load, thereby minimizing a deviation in said supply voltage to said at least one electronic device when said change in said load occurs.

18. The test system according to claim 17, further comprising:

a test device connected between said control circuit and said at least one electronic device; and a control signal associated with said anticipatory signal, said control signal being output from said control circuit to said test device, wherein said test device controls said change in said load in response to said control signal from said control circuit.

19. The test system according to claim 18, further comprising:

a delay connected between said control circuit and said test device, wherein said control signal from said control circuit is received by said test device after said anticipatory signal has been received by said power supply and said power supply has adjusted said level of said output voltage to compensate for said change in said load.

20. The test system according to claim 19, wherein said control circuit comprises a processor.

21. The test system according to claim 19, wherein said at least one electronic device is a plurality of memory devices which are subjected to at least one test.

22. The test system according to claim 21, wherein said test device operates to control said at least one test in response to said control signal from said control circuit.

23. The test system according to claim 18, further comprising:

a monitor connected between said output of said power supply and said control circuit, wherein said monitor measures said output voltage being supplied from said power supply to said electronic device during a specified test and supplies a monitor signal to said control circuit representing said measured output voltage.

24. The test system according to claim 23, wherein said monitor further provides an adjustment signal to said control circuit, said adjustment signal changing said anticipatory signal to provide further adjustments to said output voltage during a subsequent performance of a test.

25. The test system according to claim 24, wherein said control circuit uses said monitor signal to adjust said anticipatory signal to provide further adjustments to said output voltage during a subsequent performance of a test.

26. The test system according to claim 17, wherein said power supply comprises:

a power stage to provide said output voltage to an output of said power supply; and an input to receive said anticipatory signal, wherein said power stage adjusts said output voltage based on said anticipatory signal.

27. The test system according to claim 26, wherein said power supply further comprises:

a first summation circuit having a first input connected to said output of said power supply, a second input connected to said anticipatory signal, and an output.

28. The test system according to claim 27, wherein said power supply further comprises:

a reference signal input, said reference signal input representing a level of said output voltage; and a comparator having a first input connected to said reference input signal, a second input connected to said output of said first summation circuit, and an output connected to said power stage, wherein said power stage adjusts said output voltage based on a result of a comparison of said reference signal level and a signal level on said output of said first summation circuit.

29. The test system according to claim 28, wherein said power supply further comprises:

a second summation circuit having a first input connected to said reference signal input, a second input connected to a trim signal input, and an output connected to said first input of said comparator,
    whereby said trim signal input is used to provide further adjustments to said output voltage of said power supply.

30. The test system according to claim 29, wherein said trim signal can be manually adjusted.

31. The test system according to claim 29, wherein said power supply further comprises:
regulating circuitry connected between said output of said first summation circuit and said second input of said comparator, said regulating circuitry controlling a level of a signal input to said second input of said comparator from said first summation circuit.

32. The test system according to claim 31, wherein said regulating circuitry is a voltage divider.

33. A power supply for supplying an output voltage on an output to a load, said power supply comprising:
a power stage to provide said output voltage; and
an input to receive an anticipatory signal, said anticipatory signal preceding a change in said load,
    wherein said power stage adjusts said output voltage based on said anticipatory signal before said change in said load, thereby minimizing a deviation in said output voltage supplied to said load when said load change occurs.

34. The power supply according to claim 33, further comprising:
a first summation circuit having a first input connected to said output of said power supply, a second input connected to said anticipatory signal, and an output.

35. The power supply according to claim 34, further comprising:
a reference signal input, said reference signal input representing a level of said output voltage; and
a comparator having a first input connected to said reference input signal, a second input connected to said output of said first summation circuit, and an output connected to said power stage,
    wherein said power stage adjusts said level of said output voltage based on a result of a comparison of said reference signal level and a signal level on said output of said first summation circuit.

36. The power supply according to claim 35 further comprising:
a second summation circuit having a first input connected to said reference signal input, a second input connected to a trim signal input, and an output connected to said first input of said comparator,
    whereby said trim signal input is used to provide further adjustments to said output voltage of said power supply.

37. The power supply according to claim 36, wherein said trim signal can be manually adjusted.

38. The power supply according to claim 37, further comprising:
regulating circuitry connected between said output of said first summation circuit and said second input of said comparator, said regulating circuitry controlling a level of a signal input to said second input of said comparator from said first summation circuit.

39. The power supply according to claim 38, wherein said regulating circuitry is a voltage divider.

40. The power supply according to claim 33, wherein said anticipatory signal is provided by a control circuit.

41. A system for generating an anticipatory load change signal for a power control circuit, said system comprising:
a control circuit to determine an upcoming change in a load; and
an anticipatory signal generated by said control circuit based on said determined upcoming load change, said anticipatory signal being appliable to a power control circuit for adjusting said power control circuit before said load change occurs.

42. The system according to claim 41, wherein said control circuit comprises a processor.

43. A method for regulating an output voltage of a power supply in response to an anticipated change in a load, said method comprising the steps of:
determining in advance a time when said load will be changed;
providing a signal to said power supply to indicate an upcoming change in said load;
adjusting a level of said output voltage of said power supply in response to said signal; and
changing said load after said level of said output voltage of said power supply has been adjusted in response to said signal.

44. The method according to claim 43, wherein said adjusting step further comprises:
increasing said level of said output voltage.

45. The method according to claim 44, further comprising the step of:
delaying said change in said load until after said level of said output voltage of said power supply has been adjusted.

46. A method for pre-adjusting a supply voltage to a test system for at least one electronic device, said supply voltage being supplied by a power supply, said test system being controlled by a control circuit, said method comprising the steps of:
determining when an upcoming load change on said power supply is going to occur;
providing an anticipatory signal from said control circuit to said power supply; and
adjusting said supply voltage to said at least one electronic device in response to said anticipatory signal from said control circuit before said upcoming load change occurs, thereby minimizing a deviation in said supply voltage when said load change occurs.

47. The method according to claim 46, further comprising the step of:
instructing a test device to perform a test on said at least one electronic device,
    whereby performing said test causes said load change on said power supply.

48. The method according to claim 47, further comprising the step of:
delaying said instructing step until after said supply voltage has been adjusted.

49. The method according to claim 48 further comprising the steps of:
monitoring said supply voltage output by said power supply during performance of a specific test;
inputting a monitor signal to said control circuit based on said monitoring; and
adjusting said anticipatory signal from said control circuit to said power supply to further adjust said supply voltage for a subsequent performance of a test.

50. The method according to claim 49, wherein said at least one electronic device is a plurality of memory devices.

51. The method according to claim 49, wherein said control circuit comprises a processor.

* * * * *